United States Patent
Zurutuza Elorza et al.

(10) Patent No.: US 10,490,315 B2
(45) Date of Patent: Nov. 26, 2019

(54) METHOD FOR OBTAINING MULTILAYER GRAPHENE

(71) Applicant: Graphenea S.A., San Sebastián (ES)

(72) Inventors: Amaia Zurutuza Elorza, San Sebastián (ES); Alba Centeno Perez, San Sebastián (ES); Amaia Pesquera Rodrigues, San Sebastián (ES)

(73) Assignee: GRAPHENEA S.A., San Sebastián (ES)

( * ) Notice: Subject to any disclaimer, the term of this patent is extended or adjusted under 35 U.S.C. 154(b) by 0 days.

(21) Appl. No.: 15/897,627

(22) Filed: Feb. 15, 2018

(65) Prior Publication Data

US 2018/0247725 A1 Aug. 30, 2018

(30) Foreign Application Priority Data

Feb. 28, 2017 (EP) .................................. 17382099

(51) Int. Cl.
  *C23F 1/00* (2006.01)
  *H01B 1/04* (2006.01)
  (Continued)

(52) U.S. Cl.
  CPC ............... *H01B 1/04* (2013.01); *B32B 9/007* (2013.01); *B32B 37/025* (2013.01); *B82Y 30/00* (2013.01);
  (Continued)

(58) Field of Classification Search
  CPC .......... B32B 37/00; B32B 9/00; C01B 32/00; H01L 29/00; H01L 21/00; B82Y 30/00
  See application file for complete search history.

(56) References Cited

U.S. PATENT DOCUMENTS

| 9,023,220 B2 | 5/2015 | Zurutuza Elorza et al. |
| 2013/0018599 A1 | 1/2013 | Peng |

(Continued)

FOREIGN PATENT DOCUMENTS

| CN | 103342472 A | 10/2013 |
| CN | 104192833 A | 12/2014 |

(Continued)

OTHER PUBLICATIONS

Cesar J. Lockhart De La Rosa et al. "Frame assisted H2O electrolysis induced J2 bubbling transfer of large area graphene grown by chemical vapor deposition on Cu" Applied Physics Letters, Jan. 14, 2013, vol. 102, No. 2, pp. 22101-22101, XP012168803.

(Continued)

*Primary Examiner* — Gordon Baldwin
*Assistant Examiner* — Mohammad Mayy
(74) *Attorney, Agent, or Firm* — Cantor Colburn LLP

(57) ABSTRACT

A method of obtaining multilayer graphene includes the steps of depositing a first graphene monolayer having a protective layer on top thereof, on a sample having a second graphene monolayer grown on a metal foil. The method further includes the steps of attaching to the metal foil at least one second frame, the at least one first frame having a substrate and a thermal release adhesive polymer layer; and removing or detaching the metal foil. Suspended multilayer graphene or the deposited multilayer graphene is obtained by the previous method. A device having suspended multilayer graphene or deposited multilayer graphene is preferably a NEMs or MEMs sensor or a transparent electrode for example for a display or for an organic or inorganic light-emitting diode (OLED/LED).

13 Claims, 7 Drawing Sheets

(51) Int. Cl.
- B82Y 30/00 (2011.01)
- C30B 29/02 (2006.01)
- H01L 21/02 (2006.01)
- H01L 29/16 (2006.01)
- C01B 32/194 (2017.01)
- C01B 32/184 (2017.01)
- B32B 9/00 (2006.01)
- B32B 37/00 (2006.01)
- C23F 1/14 (2006.01)
- H01B 5/14 (2006.01)
- H01B 13/00 (2006.01)
- H01L 33/42 (2010.01)
- H01L 51/00 (2006.01)
- C30B 25/00 (2006.01)
- C30B 33/06 (2006.01)
- B82Y 40/00 (2011.01)
- B81B 3/00 (2006.01)
- B81C 1/00 (2006.01)
- H01L 51/52 (2006.01)

(52) U.S. Cl.
CPC .......... *C01B 32/184* (2017.08); *C01B 32/194* (2017.08); *C23F 1/14* (2013.01); *C30B 25/00* (2013.01); *C30B 29/02* (2013.01); *C30B 33/06* (2013.01); *H01B 5/14* (2013.01); *H01B 13/0036* (2013.01); *H01L 21/02527* (2013.01); *H01L 29/1606* (2013.01); *H01L 33/42* (2013.01); *H01L 51/0045* (2013.01); *B32B 2457/20* (2013.01); *B81B 3/0097* (2013.01); *B81B 2203/0127* (2013.01); *B81B 2203/04* (2013.01); *B81C 1/00158* (2013.01); *B82Y 40/00* (2013.01); *C01B 2204/22* (2013.01); *H01L 51/0021* (2013.01); *H01L 51/5215* (2013.01); *H01L 51/5234* (2013.01); *H01L 2933/0016* (2013.01)

(56) References Cited

U.S. PATENT DOCUMENTS

| | | | |
|---|---|---|---|
| 2013/0196463 A1 | 8/2013 | Zhu | |
| 2015/0123080 A1* | 5/2015 | Yamaguchi | H01L 29/42368 257/29 |

FOREIGN PATENT DOCUMENTS

| | | | |
|---|---|---|---|
| CN | 105621401 A | 6/2016 | |
| EP | 3098198 A1 * | 11/2016 | ........... C01B 32/194 |
| EP | 3135631 A1 | 3/2017 | |

OTHER PUBLICATIONS

Extended European Search Report dated Aug. 8, 2017 re: Application No. 17382099.4-1552; pp. 1-19; citing: Lee et al., Lockhard de la Rosa et al., EP 3 135 631 A1, CN 103 342 472 A, CN 104 192 833 A, CN 105 621 401 A and Chen et al.

Cheng Jin An et al. "Ultraclean transfer of CVD-grown graphene and its application to flexible organic photovoltaic cells", Journal of Materials Chemistry A, Oct. 23, 2014, vol. 2, pp. 20474-20480.

Jing-Jing Chen et al. "Fabrication and Electrical Properties of Stacked Graphene Monolayers", Scientific Reports, May 27, 2014, vol. 4, No. 1, XP055394798.

Sangchul Lee et al. "Graphene transfer in vacuum yielding a high quality graphene", Carbon, May 21, 2015, vol. 93, pp. 286-294, XP029255371.

* cited by examiner

METHOD FOR OBTAINING MULTILAYER GRAPHENE

CROSS-REFERENCED TO RELATED APPLICATIONS

This application is related to and claims the benefit of Spanish Patent Application No. EP17382099.4, filed on Feb. 28, 2017, the contents of which are herein incorporated by reference in their entirety.

TECHNICAL FIELD

The present disclosure relates to the field of graphene and, in particular, to methods of obtaining, manipulating, transferring and/or manufacturing multilayer graphene.

BACKGROUND

Since its recent discovery, graphene has attracted much attention due to its properties, such as high electronic mobility, extraordinary thermal conductivity, great strength, flexibility and transparency. These properties make graphene an ideal candidate in many applications, such as in electronics, in energy, in touch screen and display technology and in sensors. Most of these applications will require a large-scale production of graphene. A conventional way of manufacturing graphene is by rearranging the carbon atoms in a Chemical Vapor Deposition (CVD) process. In fact, CVD, in combination with metal catalysts, has become the most preferred choice for large area production of monolayer graphene. However, most of the applications require graphene transferred onto different substrates. For example, European patent application U.S. Pat. No. 9,023,220B2 discloses a method of manufacturing a graphene monolayer on insulating substrates from CVD graphene synthesis.

Graphene being a one atom thick material (one million times thinner than an A4 piece of paper) makes the handling of this material extremely challenging and difficult. In particular, graphene is expected to have excellent potential application in sensors, such as NEMs (nanoelectromechanical) or MEMs (microelectromechanical), among others. In these applications, graphene needs to be suspended on cavities or on holes. For example, United States patent application US2013/0196463A1 US2013/0018599-A1 discloses a graphene nanodevice comprising a suspended graphene layer. The graphene membrane is said to be formed on a separate substrate and transferred onto a planarized surface. According to this disclosure, a thin graphene film can be grown by CVD on copper foil. Then a thin film of polymethyl methacrylate (PMMA) is spun onto the graphene surface. Then the PMMA/graphene/copper stack is soaked in a copper etchant to remove copper. The PMMA/graphene film is then transferred to the target substrate by immersing the target substrate in water and placing the PMMA/graphene film on top. The PMMA can then be removed by using acetone or thermal treatment. The resulting graphene membrane will adhere to the planarized surface via Van der Waals interaction forces.

Graphene is also expected to have excellent potential application in combination with substrates having at least one water-soluble layer (such as $MoO_3$ or PEDOT). In these applications, in which a graphene film needs to be deposited on such substrates, a wet transfer of graphene, such as the one described in US2013/0196463-A1, is discouraged because the residual water would damage the substrate, dissolving it. In addition, the final step of the transfer process, immersing the target substrate in water, would seriously damage it.

César J. Lockhart de la Rosa et al. describe in "Frame assisted $H_2O$ electrolysis induced $H_2$ bubbling transfer of large area graphene grown by chemical vapor deposition on Cu" (Applied Physics Letters 102, 022101 (2013)) a technique for transferring a layer of graphene grown by CVD on copper, based on mechanical separation of the graphene/copper by $H_2$ bubbles during $H_2O$ electrolysis. The process is as follows: First, graphene is grown by CVD on copper followed by deposition of a support PMMA thin film. Then a polyethylene terephthalate (PET) supporting frame is placed on the top of the PMMA/graphene/Cu-sandwich. The PET-frame/PMMA/graphene/Cu-bundle is submerged into an aqueous solution and subjected to electrolysis for separating the Cu foil from the graphene by the $H_2$ bubbling. The PET-frame/PMMA/graphene-bundle is then picked up and rinsed in several deionized water baths. Next it is placed on the $SiO_2$/Si target substrate and left at room temperature until it gets dry. The PET frame is then removed by cutting. The PMMA is then dissolved by acetone. Gluing PMMA to PET frame is a complicated task because there is no adhesive element included in the PET frame.

There are also applications that require the production of several layers of graphene, also referred to as multilayer graphene. Examples of such applications are touch screen, display technology and MEMS. Multilayer graphene may be required in order to increase the electrical conductivity in transparent electrodes or the signal intensity in the graphene membrane. Multilayer graphene may be required to be suspended or deposited on a flat substrate. It may also be required to be suspended or deposited on cavities or on holes. It may also be required to be suspended or deposited on soluble substrates.

Nowadays, bilayer graphene is obtained by stacking two single layers of graphene as follows, as schematized in FIG. 1: Starting from a layer of graphene G1 deposited on a metal foil M1, a layer of PMMA PMMA1 is coated onto the graphene G1. The metal M1 underneath the graphene G1 is etched away by using a suitable etchant. The PMMA/graphene stack is then transferred onto the target substrate S1 and the PMMA layer PMMA1 is removed using a solvent. The graphene/substrate stack (G1/S1) can then receive a new PMMA/graphene stack (PMMA2/G2) obtained in a similar way (by etching the metal M2 underneath a graphene layer G2). A PMMA/graphene/graphene/target substrate stack (PMMA2/G2/G1/S1) is thus obtained. This method is called layer by layer method (LBL method). However, the PMMA residues which are left during the removal of the PMMA coating PMMA1 prior to attaching the second graphene layer G2 on the first graphene layer G1 may cause different problems, such as decreasing the contact surface between the two graphene layers, leading to poorer electrical performance (higher electrical resistivity) which is especially detrimental for all the applications. Besides, etchants used for removing the metal M1 M2 underneath the graphene G1 G2 also cause impurities to be trapped between adjacent graphene layers G1 G2.

Cheng Jin An et. al. describe in "Ultraclean transfer of CVD-grown graphene and its application to flexible organic photovoltaic cells", Journal of Materials Chemistry A, 2014, 2, 20474-20480, a graphene transfer method, in which the PMMA/graphene stack is transferred in a reversed manner onto target substrates. According to this method, PMMA is spin coated onto highly uniform graphene prepared by CVD and the metal underneath the graphene is etched away by using FeCl₃ etchant, resulting in the PMMA/graphene stack floating above the solution. Subsequent graphene layers are stacked by placing the PMMA/graphene on top of a graphene/Cu followed by etching of the Cu. After cleaning with pure water, the PMMA-coated graphene/graphene stack is transferred in a reversed manner onto the target substrate by placing the target substrate against the side of the PMMA. The resulting layers are stacked in the order graphene-graphene-PMMA-target substrate. However, it has been observed that the roughness and lack of uniformity of the PMMA layer is problematic in the case of substrates with a low roughness ($Si/SiO_2$, certain polymers, etc.) and this may induce too much roughness into the graphene layer, leading to a worsening of its properties (electrical, thermal, etc.). In addition, using this method impurities coming from the Cu etchant and other solvents may become trapped between the two or more graphene layers leading to problems in the final applications, such as shortcuts in organic light emitting diodes (OLEDs), increased roughness for the transparent electrodes and interferences in sensor measurements.

Jing-Jing Chen et al. in "Fabrication and Electrical Properties of Stacked Graphene Monolayers", Scientific Reports, 4:5065, DOI: 10.1038/srep05065 (27 May 2014) have developed a method for producing two-stacked graphene monolayers without any PMMA between the graphene layers. First, a PMMA thin layer is spin-coated on a monolayer graphene surface grown on copper foil. The copper foil is then dissolved by $FeCl_3$ saturated solution for 30 min. The graphene/PMMA film is washed three times by 60° C. deionized (DI) water. Another monolayer graphene on copper foil is used to fish out the graphene/PMMA film from deionized water. Because of the face-to-face superposition of clean graphene surfaces, there is no PMMA between the graphene layers. The copper foil is then dissolved, after which the two stacked graphene monolayers/PMMA can be transferred onto an arbitrary substrate. However, Cu etchant and other solvent residues remaining between layers, coming from the transfer process, may cause different problems, such as worsening of the graphene properties, which is especially detrimental in applications in which graphene is to be used as the transparent electrode in displays, light emitting diodes/organic light emitting diodes LEDs/OLEDs (creating shortcuts, bad OLED performance) or graphene is to be deposited on soluble substrates or on cavities or holes. Thus, when removing Cu from the PMMA/graphene/graphene/Cu sample prior to its transfer to a substrate, etchants used for removing the metal underneath the graphene cause impurities to be trapped between adjacent graphene layers.

There is therefore a need to obtain multilayer graphene in which the adjacent layers of graphene are free of impurities coming from the metal, solvent, etc. Especially if graphene is to be used in semiconductor industry applications (sensors, photonics, optoelectronics, etc.), in which several layers of graphene are usually required.

SUMMARY

The disclosure provides a method of obtaining multilayer graphene that overcomes the drawbacks of well-known methods. The new method is useful not only in applications which require that large area multilayer graphene is suspended on flat surfaces, but also in applications which require that large area multilayer graphene is suspended on cavities on holes or on water-soluble substrates. In this text, the expression "large area graphene" refers to surfaces of up to 30 cm×30 cm approximately. However, the method is not only limited to such large areas; rather, smaller areas can also be profitably used. We refer to "area" because the thickness of graphene is so small (around 0.345 nm) that a layer of graphene is substantially flat in comparison to its two remaining dimensions. In this text, the term "multilayer" applied to graphene is to be understood as a plurality of layers of graphene, such as but without limitation, 2 layers, 3 layers, 4 layers, 5 layers, 6 layers, 7 layers, 8 layers, 9 layers or 10 layers of graphene.

The new method allows obtaining uniform multilayer graphene (a plurality of layers of graphene uniformly stacked on one another). This multilayer graphene can then be suspended on cavities, as well as on water-soluble substrates, thanks to a frame that contributes to both obtaining the multilayer graphene and allowing drying and manipulation of the multilayer graphene before transferring it. Thus, multilayer graphene free of water and free of metal impurities is achieved. In addition, the new method allows obtaining much lower polymeric impurities and mechanical defects, such as holes. It also allows encapsulating interlayers such as dopants or other 2D materials in between two layers of graphene without losing the doping efficiency or the additional properties given by the additional layers.

According to a first aspect of the present disclosure, there is provided a method of obtaining multilayer graphene. The method comprises the steps of: depositing a first graphene monolayer having a protective layer on top thereof, on a sample comprising a second graphene monolayer grown on a metal foil; attaching to the metal foil a first frame, the first frame comprising a substrate and a thermal release adhesive polymer layer; removing or detaching the metal foil; depositing the stack formed by the protective layer, the first graphene monolayer, the second graphene monolayer and the first frame on a sample comprising a graphene monolayer grown on a metal foil; removing the first frame; attaching to the metal foil another frame, the another frame comprising a substrate and a thermal release adhesive polymer layer; removing or detaching the metal foil; repeating the previous stages as many times as layers of graphene need to be stacked to form a stack of multilayer graphene.

In embodiments of the disclosure, the method further comprises: at the stage in which a first frame is attached to the metal foil, attaching to the protective layer a second frame, the second frame comprising a substrate and a thermal release adhesive polymer layer; sealing the first and second graphene monolayers by pressing the first and second frames against each other, in such a way that the distance between the graphene monolayers is minimized and the graphene monolayers become totally surrounded by the outer perimeter of the frames; wherein the stack to be deposited on a sample comprising a graphene monolayer grown on a metal foil is the stack formed by the second frame, the protective layer, the first graphene monolayer, the second graphene monolayer and the first frame; wherein the stage or removing the first frame further comprises removing the second frame; wherein the stage of attaching to the metal foil another frame further comprises attaching an additional frame to the protective layer; repeating the previous stages as many times as layers of graphene need to be stacked to form a stack of multilayer graphene.

In embodiments of the disclosure, the method further comprises, once the metal foil has been removed or detached: drying the stack comprising the protective layer and graphene monolayers; depositing the stack onto a substrate; removing the frame or frames attached for the last time.

In embodiments of the disclosure, the substrate is a flat substrate or a substrate having cavities or holes or a substrate comprising a water-soluble layer.

In embodiments of the disclosure, the protective layer is selected from the following group: poly (methyl methacrylate) (PMMA), cellulose nitrate (NC), cellulose acetate butyrate (CAB), poly (lactic acid) (PLA), polyvinyl alcohol (PVA), poly (phthalaldehyde) (PPA), poly(bisphenol A carbonate) (PC), as well as any combination or derivative of any of the former compounds.

In embodiments of the disclosure, the protective layer is made of poly (methyl methacrylate) (PMMA).

In embodiments of the disclosure, the frames have a Young's modulus equal or higher than 10 MPa, more preferably higher than 500 MPa, still more preferably between 500 MPa and 6,000 MPa, and even more preferably between 1,500 MPa and 4,000 MPa.

In embodiments of the disclosure, the frames are made of REVALPHA.

In embodiments of the disclosure, the removal of the frame or frames is done by cutting through the protective layer through at least one inner border of the frame or frames.

In embodiments of the disclosure, after removing the metal foil by an etchant solution, the sample is cleaned with distilled water.

In embodiments of the disclosure, the method further comprises removing the protective layer.

According to a second aspect of the present disclosure, there is provided a method of obtaining multilayer graphene, comprising: depositing a first graphene monolayer having a protective layer on top thereof, on a sample comprising a second graphene monolayer grown on a metal foil; attaching to the protective layer a first frame and attaching to the metal foil a second frame, the first frame and the second frame comprising a substrate and a thermal release adhesive polymer layer; sealing the first and second graphene monolayers by pressing the first and second frames against each other, in such a way that the distance between the graphene monolayers is minimized and the graphene monolayers become totally surrounded by the outer perimeter of the frames; removing or detaching the metal foil while the sealing of the first and second graphene monolayers prevents impurities from damaging the first and second graphene monolayers.

In embodiments of the disclosure, the method further comprises: depositing the stack formed by the upper frame, the protective layer, the first graphene monolayer, the second graphene monolayer and the lower frame on a sample comprising a graphene monolayer grown on a metal foil; removing the first and second frames; attaching to the protective layer an upper frame and attaching to the metal foil another frame (lower frame), the frames comprising a substrate and a thermal release adhesive polymer layer; sealing the graphene monolayers by pressing the frames against each other, in such a way that the distance between the graphene monolayers is minimized and the graphene monolayers become totally surrounded by the outer perimeter of the frames; removing or detaching the metal foil while the sealing of the graphene monolayers prevents impurities from damaging the graphene monolayers; repeating the previous stages as many times as layers of graphene need to be stacked to form a stack of multilayer graphene.

According to a third aspect of the disclosure, there is provided a method of obtaining multilayer graphene. The method comprises the steps of: having a sample formed by a first graphene monolayer grown on a metal foil and wherein the first graphene monolayer has a protective layer on top thereof, attaching to said metal foil a first frame comprising a substrate and a thermal release adhesive polymer layer; removing or detaching the metal foil; depositing the stack formed by the protective layer, the first graphene monolayer and the first frame on a sample comprising a graphene monolayer grown on a metal foil; removing the first frame; attaching to the metal foil another frame, the another frame comprising a substrate and a thermal release adhesive polymer layer; removing or detaching the metal foil; repeating the previous stages as many times as layers of graphene need to be stacked to form a stack of multilayer graphene.

Like in previous embodiments, a second frame attached to the protective layer may be attached. The additional advantages of using two frames are thus achieved.

According to another aspect of the present disclosure, suspended multilayer graphene or deposited multilayer graphene is obtained by the method previously described.

According to another aspect of the present disclosure, it is provided a device comprising suspended multilayer graphene or deposited multilayer graphene obtained by the method previously described, the device being preferably a NEMs or MEMs or a transparent electrode, for example but without limitation, for displays or for organic or inorganic light-emitting diodes (OLED/LED).

Additional advantages and features of the disclosure will become apparent from the detailed description that follows and will be particularly pointed out in the appended claims.

BRIEF DESCRIPTION OF THE DRAWINGS

To complete the description and in order to provide for a better understanding of the disclosure, a set of drawings is provided. Said drawings form an integral part of the description and illustrate an embodiment of the disclosure, which should not be interpreted as restricting the scope of the disclosure, but just as an example of how the disclosure can be carried out. The drawings comprise the following figures:

FIG. 2A shows a metal foil, on both sides of which graphene has grown. An adhesive polymer is applied in order to remove one of the graphene layers. FIG. 2B shows a graphene monolayer/metal foil, after detaching the adhesive polymer and the bottom graphene layer.

In FIG. 8A, the sample is formed by a frame/protective layer/graphene layer/graphene layer/frame stack. In FIG. 8B, the sample is formed by a protective layer/graphene layer/graphene layer/frame stack.

DETAILED DESCRIPTION OF THE DRAWINGS

Figure 1:
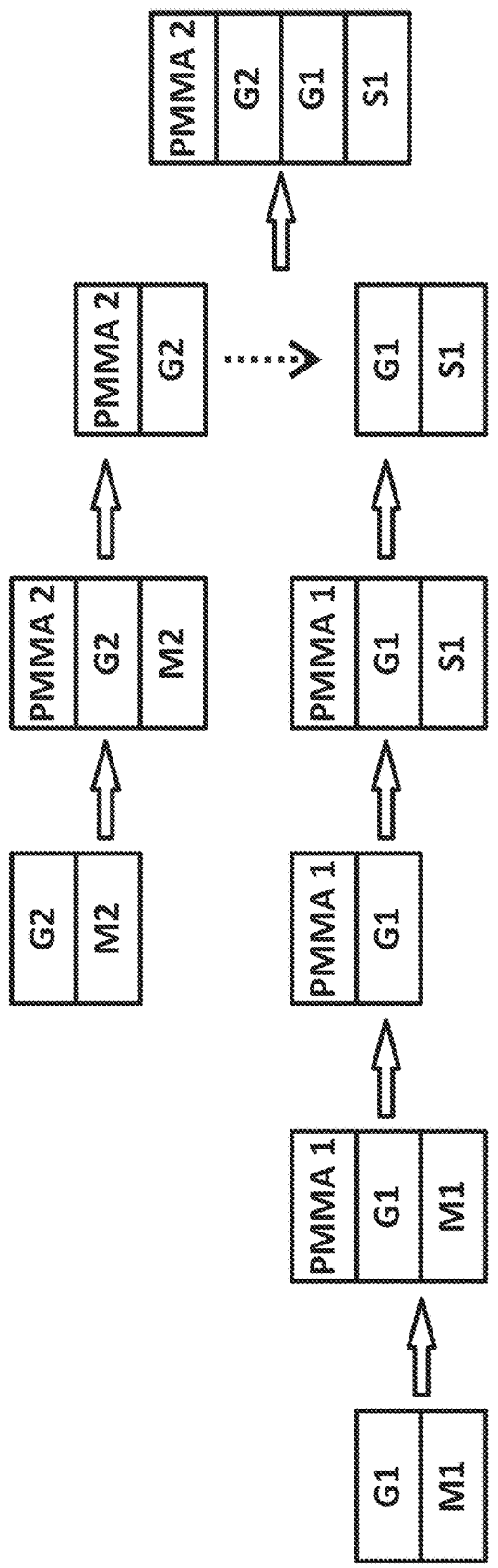
FIG. 1 illustrates in schematic form a conventional process of obtaining bilayer graphene.

In this text, the term "comprises" and its derivations (such as "comprising", etc.) should not be understood in an excluding sense, that is, these terms should not be interpreted as excluding the possibility that what is described and defined may include further elements, steps, etc.

In the context of the present disclosure, the term "approximately" and terms of its family (such as "approximate", etc.) should be understood as indicating values very near to those which accompany the aforementioned term. That is to say, a deviation within reasonable limits from an exact value should be accepted, because a skilled person in the art will understand that such a deviation from the values indicated is inevitable due to measurement inaccuracies, etc. The same applies to the terms "about" and "around" and "substantially".

The following description is not to be taken in a limiting sense but is given solely for the purpose of describing the broad principles of the disclosure. Next embodiments of the disclosure will be described by way of example, with reference to the above-mentioned drawings showing apparatuses and results according to the disclosure.

A method for obtaining multilayer graphene is explained next. The method allows obtaining large area uniform multilayer graphene and transferring said multilayer graphene while preventing impurities from being trapped between adjacent layers of graphene.

In embodiments of the disclosure the starting point is bilayer graphene on a metal foil, such as copper (Cu). In other embodiments of the disclosure, a monolayer graphene on a metal foil may also be the starting point, that is to say, the method of the present disclosure may be used to obtain bilayer graphene.

In embodiments of the disclosure, the starting point is a stack formed by protective layer/graphene/graphene/metal foil. A preferred way of obtaining a sample comprising bilayer graphene is described next. Well-known alternative methods of obtaining bilayer graphene could be used instead.

Currently, the most usual way of obtaining monolayer graphene is by CVD (Chemical Vapour Deposition). There are alternative ways of obtaining monolayer graphene, such as the micromechanical exfoliation of graphite or the sublimation of silicon carbide (SiC) substrates. However, they are not industrially scalable methods to obtain large area graphene coverage on arbitrary substrates. The micromechanical exfoliation method typically produces monolayer flakes that range from 500 nm up to a few micrometers. In turn, the graphene obtained from the sublimation of Si atoms from SiC, is extremely difficult to detach from the SiC substrate, especially large areas of graphene. CVD has emerged as the method of choice for large area production of monolayer graphene. The use of CVD in combination with copper catalysts has enabled the relatively large-scale production of monolayer graphene. In the method of the present disclosure, CVD graphene is preferably obtained by any conventional CVD process for obtaining graphene, and in particular, for obtaining a graphene monolayer. The CVD reaction can be undertaken using different types of CVD equipment, such as cold walled and hot walled reactors. During the deposition process, a solid, liquid or gas carbon source is inserted into the reactor chamber. At high temperatures (normally between 600 and 1100° C.) graphene is formed on the catalyst surface (normally copper catalyst). This process can be done either at atmospheric pressure or under vacuum. Plasma can be added during graphene growth if growth at lower temperatures is desired.

Figure 2A:
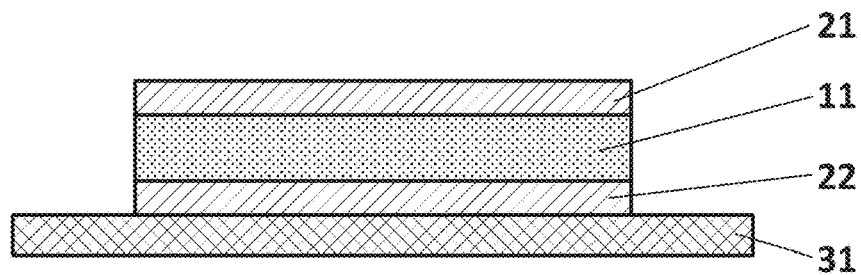
FIGS. 2A and 2B illustrate a process of obtaining CVD graphene according to an embodiment of the disclosure.

Graphene is usually grown on top of thin metal films on silicon substrates or on metal foils. A skilled person in the art knows that thin metal films are normally thinner than metal foils. The metal can be copper. Semiconductors or insulating materials can alternatively be used to grow graphene. Among the advantages of the copper foils are their low cost, flexibility and easy handling. Graphene can be deposited on metal foils (such as copper foils) of thicknesses varying from around 10 µm up to 1000 µm. FIG. 2A shows a metal foil 11, such as a copper foil. Graphene typically grows on both sides of the foil. For this reason, one of the graphene layers is normally eliminated unless large areas of bilayer graphene are required or at least are harmless. Applying a CVD process, a first monolayer of graphene 21 is grown on the top surface of the foil 11 and a second monolayer of graphene 22 is grown on the bottom surface of the foil 11.

One of the monolayers of graphene (for example the bottom one 22) is eliminated preferably by applying a thermal release adhesive polymer tape 31 onto that graphene monolayer, as shown in FIG. 2A. This tape comprises a substrate and a thermal release adhesive polymer layer. Substrates usually comprise polymers like polyesters (polyvinyl acetate, polyethylenevinyl acetate, polyethylene terephthalate, polyethylene naphthalate, etc.), polyacrylates (polymethyl acrylate, polyethyl acrylate, polypropyl acrylate, polybutyl acrylate, etc.), polymethacrylates (polymethyl methacrylate, polyethyl methacrylate, polypropyl methacrylate, polybutyl methacrylate, polyhydroxyethyl methacrylate), polyolefins (polyethylene, polypropylene), polyimides, polyamides, polycarbonates, polyether ether ketones, polyphenylene sulfide, polyvinyl chloride, or mixtures thereof. The thermal release adhesive polymer layer usually comprises one or more polymers selected from acrylic polymers, vinyl alkyl ether polymers, PEVA, silicone rubber, rubber (butyl rubber, natural rubber), urethane polymers, styrene-diene block copolymers, nitrile polymers, fluorine based polymers and their mixtures. In addition this adhesive polymer layer can also contain additives and/or foaming agents, such as microspheres. According to a particular embodiment, the thermal release adhesive polymer tape is REVALPHA, a commercially available adhesive tape.

The thickness of the adhesive polymer tape 31 is usually between 0.01 and 1 mm and preferably between 0.01 and 0.25 mm. The adhesive polymer tape 31 can be applied, for example, using a pressure and speed controlled roller, for example such as one speed controlled roller as disclosed in U.S. Pat. No. 9,023,220B2. The rolling means is out of the scope of the present disclosure. This machine enables the application of the adhesive tape on the graphene layer (for example bottom layer) instead of doing it by hand; applying controlled pressure and speed by rolling means avoids the formation of bubbles between the bottom graphene layer/ metal foil and the adhesive polymer tape 31. Preferably, the applied pressure varies between 0.01 to 0.8 MPa; it is preferably applied for a time period varying between 1 to 240 seconds, depending on the dimensions of the graphene layer to be removed.

Figure 2B:
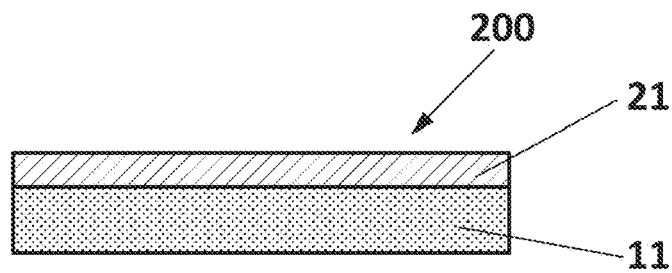

The adhesive polymer tape 31 is then detached from the metal foil 11, thus removing the bottom graphene layer 22, as shown in FIG. 2B. Such detaching process is out of the scope of the present disclosure. The detaching process is preferably done by applying heat, for example as follows: The sample formed by the top graphene monolayer/metal foil/bottom graphene monolayer/adhesive polymer tape is deposited on a hot plate and exposed to a temperature varying between 1 and 20° C. above the release temperature of the adhesive polymer tape 31. Such applied temperature preferably varies between 1 and 5° C. above the release temperature of the adhesive polymer tape 31. Once the adhesive polymer tape 31 and the unwanted graphene monolayer 22 have been detached, the desired graphene monolayer/metal foil stack 200 (FIG. 2B) is ready to be transferred onto a substrate, for example by using a conventional wet transfer process.

Figure 2C:
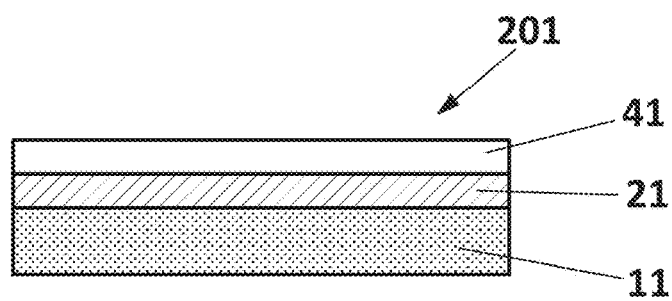
FIG. 2C shows a protective layer applied on top of the graphene layer/metal foil stack of FIG. 2B.
Figure 2D:
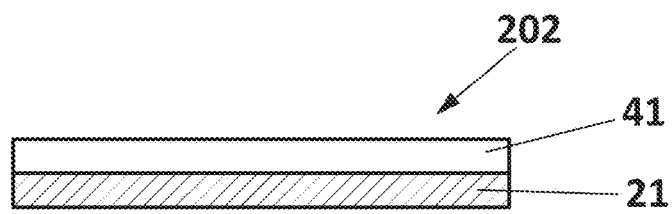
FIG. 2D shows the protective layer/graphene monolayer of FIG. 2C after removing the metal foil.

The sample 200 is then coated with a sacrificial protective layer 41, as shown in FIG. 2C, which is applied on the desired (not removed) graphene layer 21. Non-limiting examples of materials to be used as protective layer 4 are: polymethyl methacrylate (PMMA), cellulose nitrate (NC), cellulose acetate butyrate (CAB), poly(lactic acid) (PLA), poly(phthalaldehyde) (PPA), poly(bisphenol A carbonate) (PC), polyvinyl alcohol (PVA), their derivatives, as well as combinations thereof. The thickness of the protective layer 41 is preferably between 20 nm (nanometers) and 10 μm (micrometers or microns); and more preferably between 100 and 1000 nm. In a particular embodiment, the protective layer 41 comprises polymethyl methacrylate (PMMA). Although in the current embodiment the sacrificial protective layer 41 has been applied after eliminating the bottom layer of graphene 22, in an alternative embodiment the detachment of such graphene layer 22 using an adhesive polymer tape 31 can be done after applying the sacrificial protective layer 41 on the wanted graphene layer 21. The sample including layer 41 is referred to as 201 in FIG. 2C. The metal foil 11 is then removed. Non-limiting exemplary ways of removing the metal foil 11 are using a metal etchant (such as Cu etchant) or using electrochemical delamination (bubbling). The sample after removing the metal foil is referred to as 202 in FIG. 2D.

Figure 3:
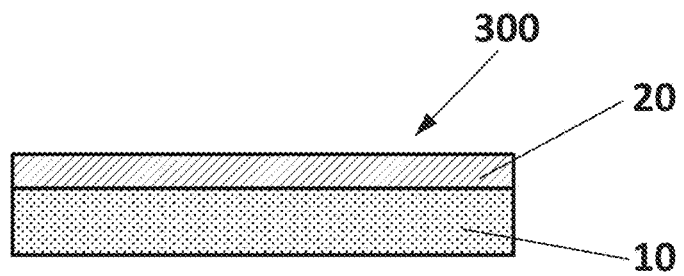
FIG. 3 shows another sample formed by a graphene monolayer/metal foil, similar to the one illustrated in FIG. 2B.

FIG. 3 shows a sample 300 formed by another monolayer graphene 20 on metal foil 10 (i.e. copper foil), similar to the one shown in FIG. 2B. This sample 300 is obtained in a similar way as the one shown in FIG. 2B. Sample 202 (FIG. 2D) is stacked on top of this monolayer graphene on copper foil (sample 300, FIG. 3), thus obtaining a sample 400 shown in FIG. 4, wherein metal foil is referred to as 10, the two monolayers of graphene are referred to as 20 21 and the protective layer is referred to as 41.

In sum, sample 400, comprising bilayer graphene on metal (i.e. Cu), may be obtained by any conventional methods for obtaining a bilayer graphene. In embodiments of the disclosure, sample 400 has been obtained by applying the already cited method described by Jing-Jing Chen et al. in "Fabrication and Electrical Properties of Stacked Graphene Monolayers", Scientific Reports, 4:5065, DOI: 10.1038/srep05065 (27 May 2014). In the sample shown in FIG. 4, there are no PMMA residues in between the graphene layers because the second graphene/metal sample did not comprise a PMMA layer. There are neither etchant residues because the graphene/graphene/metal stack has not been exposed to the first etchant bath because the PMMA/graphene stack floating on water (after being cleaned) has been preferably fished with a graphene/metal stack. However, one of the main drawbacks of the method disclosed by Chen starts when the metal (Cu) is removed from the PMMA/graphene/graphene/Cu stack since etchant and other impurities used during the elimination of the Cu and subsequent cleaning penetrate in between the graphene layers and they are trapped there. Subsequent cleanings of the PMMA/graphene/graphene stack do not solve the issues of the trapped impurities between the layers, leading to a detrimental performance of the bilayer graphene on the final substrate, such as worsening of the electrical and thermal properties. In the sample in FIG. 4, the thickness of each graphene layer 20 21 is around 0.3 nm (nanometers); the thickness of the metal foil 10 is preferably between 5 and 100 μm and more preferably between 10 and 30 μm; and the thickness of the protective layer 41 is preferably between 20 nm and 10 μm (micrometers or microns) and more preferably between 100 nm and 1000 nm (1 μm). Due to the characteristics of graphene, between two graphene layers there is always a distance larger than 3.35 Å. In order for this distance between graphene layer to be as close as possible to this threshold (3.35 Å), a stage of drying the sample 400 is preferably performed. The sample 400 may be dried by conventional means, such as, but without limitation, at temperatures ranging between 100 and 200° C. (degrees Celsius) and for time duration ranging between 30 m (minutes) and 2 h (hours).

As already mentioned, detaching (i.e. etching away) the metal 10 underneath the graphene layer 20, in order to keep on stacking additional layers of graphene, severely degrades the stack of graphene layers, since etchants used for removing the metal 10 result in impurities being trapped between adjacent graphene layers.

Figure 4:
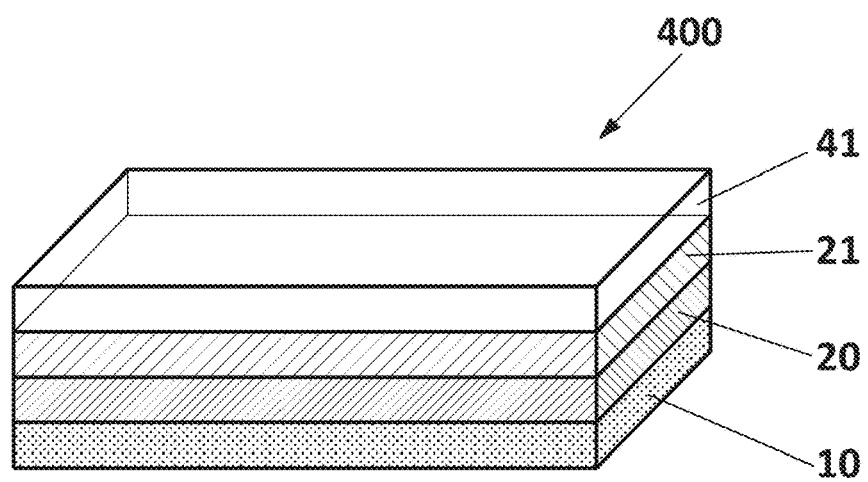
FIG. 4 shows a sample formed after stacking the protective layer/graphene monolayer of FIG. 2D on top of the graphene monolayer/metal foil of FIG. 3.
Figure 5:
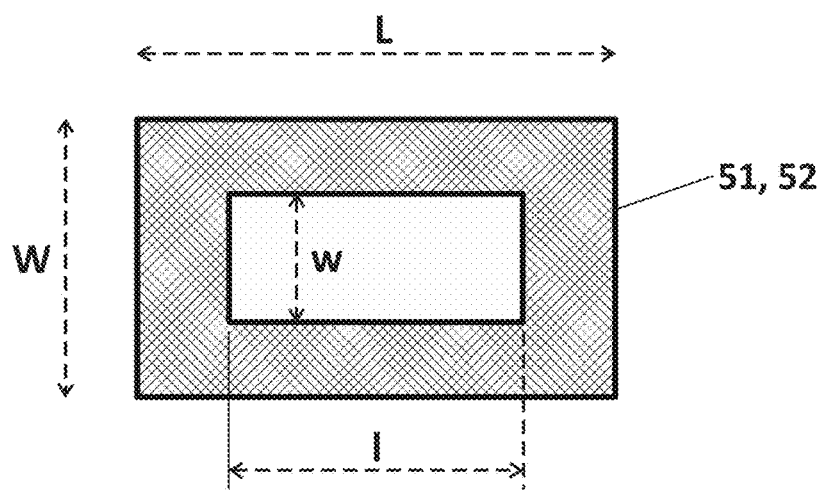
FIG. 5 shows a top view of an exemplary frame used in the process of obtaining multilayer graphene of the disclosure.
Figure 6A:
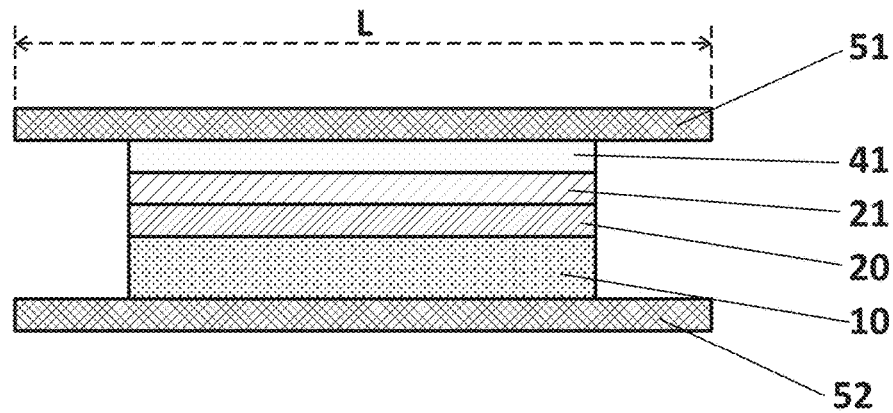
FIG. 6A shows the sample of FIG. 4, in which two frames are sandwiching the sample.
Figure 6B:
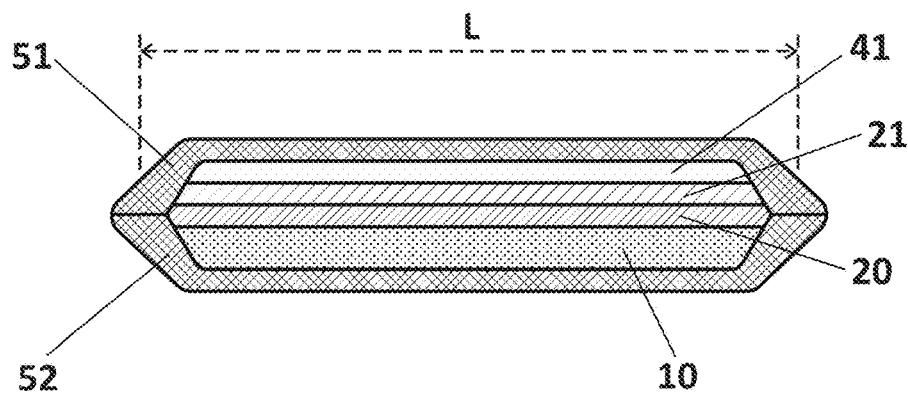
FIG. 6B shows the sample plus frames of FIG. 6A, in which the border of each frame has been squashed against each other in order to seal the graphene layers.
Figure 6C:
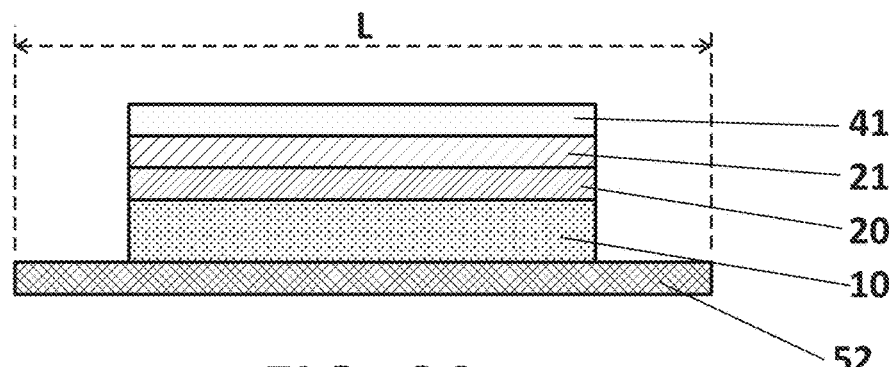
FIG. 6C shows the sample of FIG. 4, in which one frame is attached to the sample.

In order to solve this problem, at least one frame 52 is applied to the sample 400 of FIG. 4. The at least one frame 52 is preferably applied at the bottom of the stack, that is to say, beneath metal foil 10. In embodiments of the disclosure, two frames 51 52 are applied to the sample 400 of FIG. 4. The at least one frame is an element that provides integrity, permitting for example the handling of the sample 400. For example, the sample including the one or two frames can be handled by means of tweezers or automatic equipment such as robotic arms. FIG. 5 shows a top view of an exemplary frame 51 52. When two frames are used, one of the frames 51 is attached on the sacrificial protective layer 41 and the other frame 52 is attached on the metal layer 10, as shown in FIG. 6A. When only one frame 52 is used, the frame is preferably attached on the metal layer 10, as shown in FIG. 6C. Each frame 51, 52 comprises a substrate and a thermal release adhesive polymer layer. Both the substrate and the thermal release adhesive polymer layer may comprise the same polymers as above disclosed for the adhesive polymer tape 31, and the polymer layer may also comprise additives and/or foaming agents, like microspheres.

Each frame 51 52 is a flat element to be attached or glued to the metal foil 10 and, when two frames are used, also to the protective layer 41. The thickness of the frame 51 52 is preferably between 0.01 and 1 mm (millimeters), more preferably between 0.01 and 0.1 mm and still more preferably between 0.01 and 0.02 mm. The frame 51 52 forms a flat ring of any shape, as shown in FIG. 5. The term "ring" refers to its shape having a hollow (through hole) or "closed loop", and does not necessarily refer to a circular or oval shape. The shape of the flat ring forming the frame can be square or rectangular, as shown in FIG. 5, or a different one. Other shapes are possible, provided that they fit with the shape of the sample and in turn with the shape of the target substrate. The at least one frame is required to handle the sample. It additionally serves at preventing the presence of impurities in the vicinity of the graphene layers 21 20 or between them added for example during the removal of the metal foil. In embodiments in which two frames 51, 52 are used, as shown in FIG. 6A, apart from serving at handling the sample and at preventing the presence of impurities, the frames also serve at sealing/isolating/encapsulating the graphene layers 21 20 in order to increase the prevention of impurities in the vicinity of the graphene layers 21 20 or between them and to prevent friction between adjacent graphene layers by minimizing the distance between adjacent layers. FIG. 6B shows the sample and frames of FIG. 6A, wherein the external part of the frames (outer perimeter or border) extending from the sample has been squashed by homogeneously pressing one against the other one, in order to homogeneously seal as much as possible the sample sandwiched between the frames 51 52. By pressing the frames against each other, the two (or more) layers of graphene are maintained in their correct position (with respect to each other) and the distance between adjacent layers is minimized, preventing friction between graphene layers. In applications in which for example a dopant needs to be inserted in between consecutive graphene layers, the right position of the graphene layers and the sealing of the assembly is guaranteed by pressing the two frames against each other. The sealing is preferably done by pressing, either manually or using pressing means. The outer dimension of the frames 51 52 (outer border of the ring) is larger than the respective dimension of the sample. As shown in the embodiment of FIGS. 6A-6C, the outer length L and width W of the frame 51 52 are larger than respectively length and width of the sample on which the frame(s) is (are) to be attached. The inner length l and width w of the frame are substantially the same as respectively length and width of the sample. In relation to FIGS. 6A-6B, because the dimensions (length and width) of the frames 51 52 are larger than respective dimensions of the sample, when the two inner parts of the frames are put together and pressed against each other (the inner part of the frames is adhesive), the graphene layers 21 20 are isolated within a seal or capsule formed by the protective layer 41 (above graphene layer 21), the metal foil 10 (under graphene layer 10) and the two frames 51 52 (outer perimeter of graphene layers 21 20), as shown in FIG. 6B. The sample comprising bilayer graphene as shown in FIGS. 6B-6C is now ready to be submitted to a treatment for removing the metal foil 10, which is exposed to the air or etchant (if metal is removed using a metal etchant) or electrolyte (if metal is removed using electrochemical delamination (bubbling)) through the hollow part defined by frame 52.

The frame 51, 52 must have a Young's modulus equal or higher than 10 MPa and more preferably higher than 500 MPa. Still more preferably, the frame 51, 52 has a Young's modulus between 500 MPa and 6,000 MPa; and even more preferably between 1,500 MPa and 4,000 MPa. The inventors have observed that adhesive tapes with this feature, provide the frames with surprising advantages over other materials, which may cause the frame to bend, causing the graphene to wrinkle during manipulation and making the drying stage difficult. The selected frame 51 52 is stable, rigid, easy to handle and does not generate substantial tension during the etching or metal detaching/delamination stage. In addition, unlike the frame chosen by De la Rosa et. al., the selected frames 51 52 are easily attached onto the protective layer surface 41 or metal foil 10, respectively, due to the adhesive polymer layer of the frame. Inventors have observed that the frames used in prior-art transfer methods are discouraged in transfer processes involving large-area graphene. The adhesive part of frame 51 52 must stand any stages of cleaning, metal removal, etc.

In a particular embodiment, the frames 51 52 are fabricated using REVALPHA adhesive tape, which is easily glued to the protective layer and metal foil sample.

Figure 7:
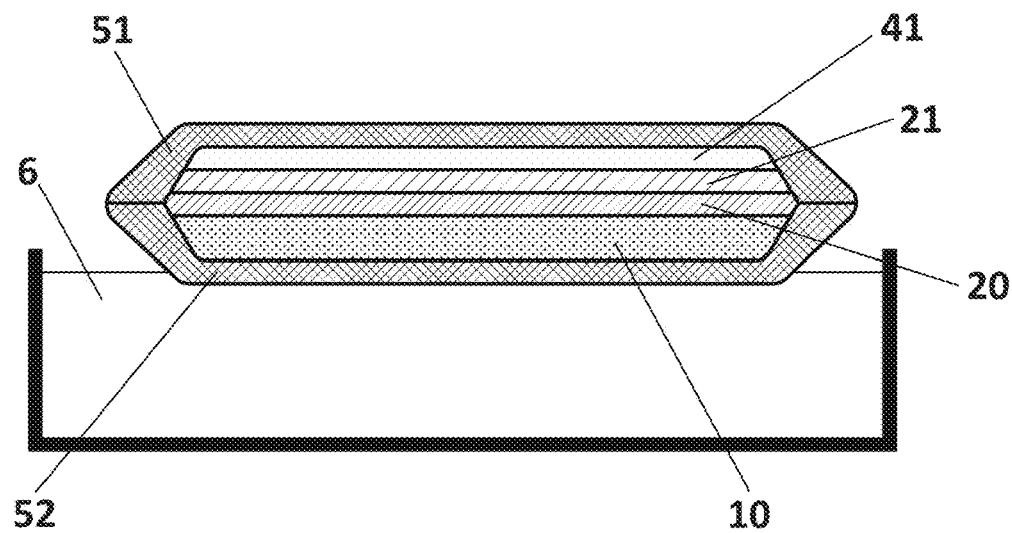
FIG. 7 shows the stage of removing the metal foil in a possible embodiment of the disclosure, by picking up the sample and making it float into an etchant solution.
Figure 8A:
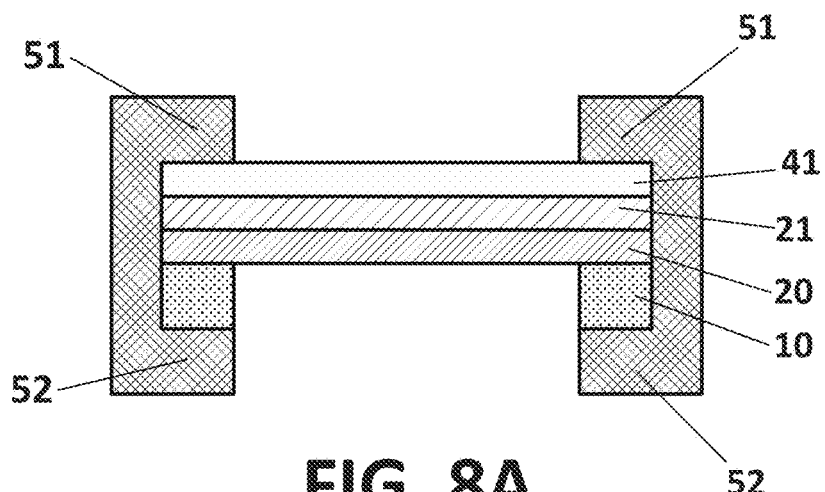
FIGS. 8A-8B show cross-sectional views of a sample after removing the metal foil.
Figure 8B:
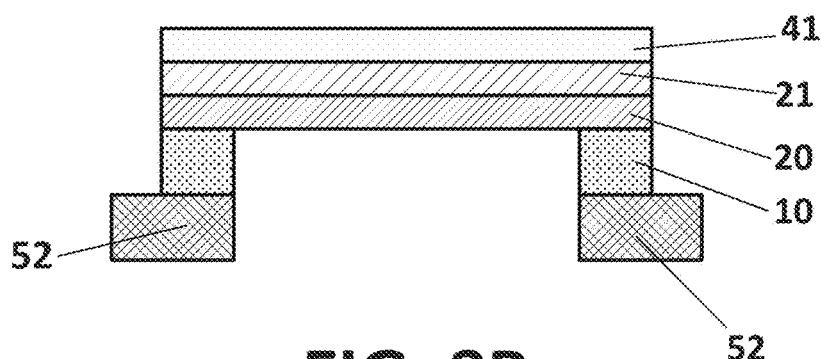

The sample comprising bilayer graphene is now ready for removal of the metal foil 10. The metal foil 10 may be removed from the sample in a similar way as the one shown in FIGS. 2C-2D. Thanks to the at least one frame 52, the sample has enough integrity for it to be handled (for example using tweezers or robotic arms). Also, thanks to the at least one frame 52, the sample is isolated from the presence of impurities that may be inserted between graphene layers during the removal of the metal foil 10. In embodiments in which two frames 51, 52 are used, as disclosed with reference to FIGS. 6A-6B, because the sample comprising bilayer graphene is sealed by the frames, the two layers of graphene 21 20 are still better isolated from potential impurities and water that may be left during the removal of the metal foil. In a particular embodiment, removal of the metal foil 10 is done by picking up the sample as for example shown in FIG. 6B or 6C, which can be handled thanks to the frame 52 (in FIG. 6C) or frames 51 52 (in FIG. 6B), and making it float onto an etchant solution 6. This is illustrated in FIG. 7. FIG. 7 refers to the sample having two frames (FIG. 6B) but it similarly applies to a sample having one frame (FIG. 6C). When the metal foil is a Cu foil, the etchant solution 6 may be a Cu etchant solution. The metal foil may alternative be a Ni foil, in which case the etchant solution 6 may be a Ni etchant solution. The etchant solution 6 may for example be $FeCl_3$ or ammonium persulphate or $HCl/H_2O_2$ (hydrochloric acid/oxygenated water). This etchant solution permits to get rid of the metal foil 10. And, thanks to the frame 52 (for example FIG. 6C) or the two frames 51, 52 (see for example FIG. 6B), impurities from the etchant solution are prevented from being inserted between the graphene layers. It is remarked that although not encapsulated, in FIG. 6C the frame 52 isolates the graphene layers from the etchant solution thanks to the thickness of the frame 52, which makes the graphene layers float above the level of etchant solution. Afterwards, in order to remove etchant residues, the sample, substantially free of metal, is preferably cleaned several times with fresh distilled water. In embodiments of the disclosure, additional cleaning with specific compositions, such as $HCl:H_2O_2$ or $NH_4OH:H_2O_2$, may be used in order to remove potential metal residues that may also contaminate the sample. In an alternative embodiment, removal of the metal foil and detachment of the (frame)/protective layer/graphene layer/graphene layer is done by $H_2$ bubbles during $H_2O$ electrolysis, as a skilled person in the art is aware of. Alternatively, removal of the metal foil and detachment of the (frame)/protective layer/ graphene layer/graphene layer is done by spraying the assembly with an etchant solution (i.e. Cu etchant solution). The outcome of this stage of removing the metal foil is shown in FIGS. 8A and 8B, wherein respective cross-sectional views of a sample formed by a frame/protective layer/graphene layer/graphene layer/frame stack is shown in FIG. 8A and a sample formed by a protective layer/graphene layer/graphene layer/frame stack is shown in FIG. 8B. All the metal foil 10 not covered by frame 52 (see the hollow part of the frame illustrated in FIG. 5) has been removed.

Figure 9:
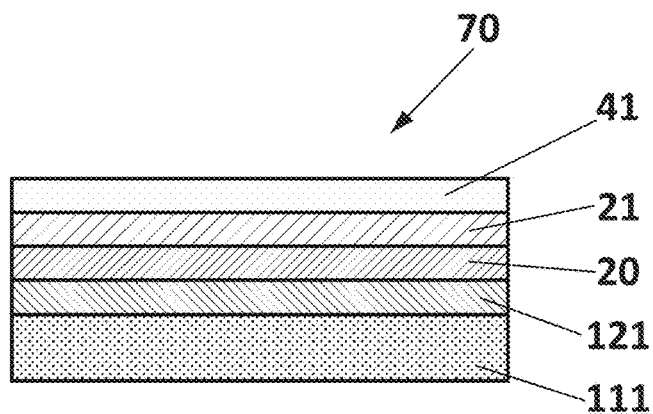
FIG. 9 shows how a new graphene monolayer is added by stacking the protective layer/graphene monolayer/graphene monolayer on top of a graphene monolayer/metal foil.

Once the metal foil 10 has been removed, as shown in FIGS. 8A and 8B, the frame/protective layer/graphene layer/graphene layer/frame stack or protective layer/graphene layer/graphene layer/frame stack is transferred onto the final substrate or onto a new graphene/metal foil in order to respectively obtain bilayer graphene on an arbitrary substrate or continue to prepare a trilayer graphene sample. The stack may also be stacked on a graphene layer/metal foil stack 200 like the one shown in FIG. 2B by any conventional layer-by-layer method (LBL method). A sample 70 comprising 3-layer graphene is obtained, as shown in FIG. 9. After such transfer, frame 52 or frames 51, 52 must be either cut from the sample or thermally released therefrom. That is why the inner length l and width w (in general, inner dimension) of the frames are substantially the same as respectively length and width of the sample: removal of the frame is preferably done by cutting through the protective layer 41 at the inside borders. Alternatively, it may be done by heating (thermal release). The specific size and shape of the frames 51 52 will depend on the number of graphene layers that will form the multilayer graphene and on the final substrate used (substrate to which the multilayer graphene is to be transferred). In embodiments in which the frame or frames are going to be thermally released, the dimensions of the frames do not need to be larger than those of the substrate. Instead, in this case the dimensions of the frames can be substantially the same as the dimensions of the substrate or smaller. This is to be considered as an example, since larger areas of graphene can be transferred thanks to the proposed method.

Figure 10A:
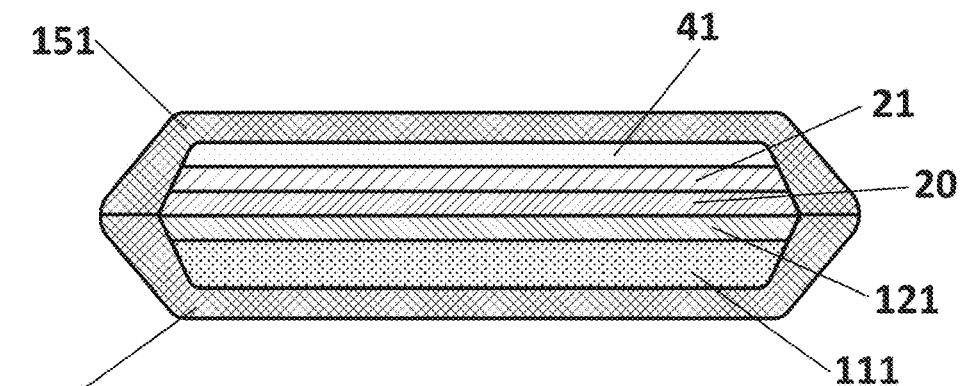
FIG. 10A shows the sample of FIG. 9, in which two frames are sandwiching the sample.
Figure 10B:
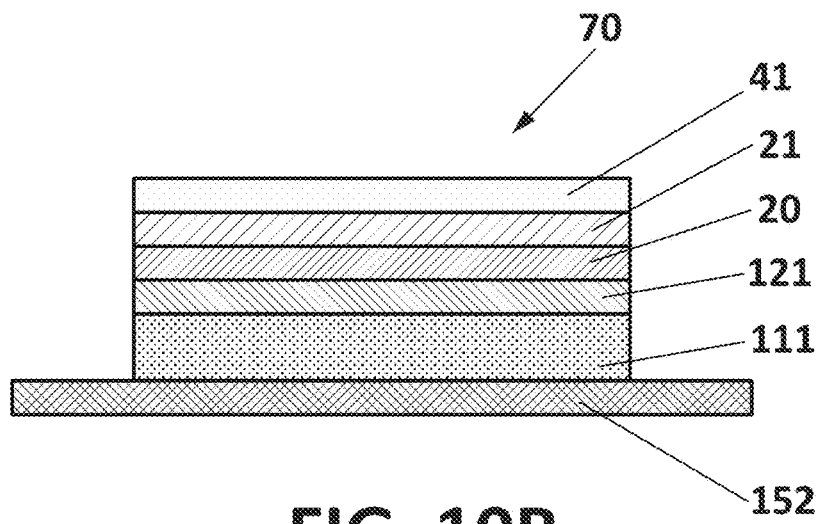
FIG. 10B shows the sample of FIG. 9, in which one frame is attached to the sample.

We refer now to the sample 70 formed by protective layer/graphene layer/graphene layer/graphene layer/metal foil stack illustrated in FIG. 9. It is remarked that in order not to reuse numerical references, the graphene layer/metal foil stack on which the bilayer stack is in turn stacked, is now referred to as 121, 111, wherein 111 refers to the metal foil (11 on FIG. 2B) and 121 refers to the graphene layer (21 in FIG. 2B). The process of applying one frame 152 or two frames 151 152 is then repeated, as shown in FIGS. 10B and 10A respectively, in a similar way as with reference to FIGS. 6A-6C: In FIG. 10B, a lower frame 152 is attached on the metal foil 111, thus providing integrity and preventing impurities, such as metal impurities, and water from damaging the graphene layers 21 20 121. In FIG. 10A, an upper frame 151 is attached on the protective layer 41 and a lower frame 152 is attached on the metal foil 111, thus providing integrity, preventing impurities and water from damaging the graphene layers 21 20 121 and contributing to maintain the graphene layers in their right position with respect to each other. This process may be repeated as many times as desired (as many times as layers of graphene need to comprise the multilayer graphene). If, for example, 3-layer graphene is required, the metal foil 111 is removed once the frame 152 or the frames 151, 152, as the case may be, have been attached. The frame 152 or frames 151, 152 may be removed once the assembly including the frame or frames has been transferred to the target substrate. In other words, the frame or frames are not removed until the whole stack comprising multilayer graphene has been transferred to a target substrate. If for example 6 layers of graphene need to be stacked, the process of adding one more graphene monolayer by stacking the already stacked graphene layers on a new graphene monolayer grown on a metal foil is repeated until the sample comprises 6 graphene monolayers.

Prior to depositing or suspending the stack of graphene layers 21 20 121 onto a target substrate, sometimes the graphene layers need to be dried, because if graphene is wet when it is deposited onto a substrate having cavities or holes, the graphene collapses with the water that has fallen into the cavities of the substrate; or if graphene is wet when it is deposited on a substrate having at least one water soluble layer, the water soluble layer will be dissolved or permanently damaged. So, when the stack of graphene layers is clean, the sample is taken out of the cleaning water and the remaining water is dried. The sample must be dried for a certain time: In embodiments of the disclosure, this time is the time required for graphene becoming totally dry, while the protective layer maintains certain humidity in order to keep flexibility (if it does not maintain certain flexibility, it may become glassy and it may easily break when it is deposited onto a substrate). Preferably the sample is dried from a few seconds (2-3 seconds) up to a few minutes (around 10 minutes). It is preferably dried at room temperature or up to 100° C. In embodiments of the disclosure, in which the protective layer is already fully dried, the sample is preferably dried at a temperature ranging between 150 and 170° C., for example between 158 and 162° C. In embodiments of the disclosure, the sample may be dried once the stack of graphene layers is deposited or suspended onto a target substrate. In these cases, the sample may be dried either under atmospheric pressure or vacuum, using inert atmosphere, reducing atmosphere or air. In a preferred embodiment, the sample is dried using a $N_2$ gun.

The resulting multilayer graphene stack may be deposited onto a substrate. The substrate may be a flat substrate or a substrate having cavities or holes or a water-soluble substrate. Non-limiting examples of target substrates on which the sample can be deposited are: 300 nm $SiO_2$/Si with cavities, metallic layer/$SiO_2$/Si with cavities (metallic layer can be Au, Pd, Pt, Ni, etc.), $Al_2O_3$, $MoO_3$/Si, $AuCl_3$/Si, or others. The target substrate is preferably heated prior to receiving the sample. The dried sample (protective layer/multilayer graphene layer/frame if only one frame has been used, or frame/protective layer/multilayer graphene layer/frame if two frames have been used) is then placed on top of the target substrate. In embodiments of the disclosure, once placed on the target substrate, the sample may be dried up at a temperature preferably ranging between room temperature and 200° C., and also preferably, from a few seconds (2-3 seconds) up to a few hours (around 2 hours). In embodiments of the disclosure it may be dried using atmospheric pressure or vacuum. In embodiments of the disclosure it may be dried using inert atmosphere, reducing atmosphere or air. In embodiments of the disclosure the sample is left on the substrate at room temperature until it is dry and then put under vacuum, for example, but without limitation, at around 80° C.

The sample then remains substantially adhered to the substrate by means of Van der Waals interaction forces. Afterwards, the frame or frames are easily removed, for example but without limitation by cutting through the protective layer at the inner borders of the frame or frames or by thermal release. Once the frame or frames have been removed, the sample may be baked to improve adhesion. In a particular embodiment, the sample may be baked from a few seconds (2-3 seconds) up to a few hours (around 2 hours). In a particular embodiment, the sample may be baked at a temperature varying from room temperature up to 300° C., preferably between 170° and 250° C. In embodiments of the disclosure it may be baked using atmospheric pressure or vacuum. In embodiments of the disclosure it may be baked using inert atmosphere, reducing atmosphere or air. The protective layer is then removed. This may be done by means of a thermal treatment, since weight applied by solvents may break the multilayer graphene layer in the case that the graphene is suspended on cavities. Alternatively, the protective layer may be removed using acetone vapor. In embodiments in which it is removed by thermal treatment, it may be removed by thermal treatment at a temperature varying between 150° and 500° C. for a time period varying between 10 mins and 4 hours, using an inert, reducing or non-oxygen containing atmosphere, such as $N_2$, Ar, $H_2$, Ar, vacuum, etc. or a combination of them. In yet another embodiment the protective layer may be removed by dipping into solvents such as acetone.

The performance of the multilayer graphene has been analyzed using non-destructive techniques, such as optical microscopy. The quality of the graphene films has been analyzed using Raman spectroscopy, AFM and SEM. The multilayer graphene produced using the process described in this disclosure has a very high quality, cleanliness, yield, homogeneity and uniformity, as it will be demonstrated in the following examples. Besides, the performance of the suspended multilayer graphene on cavities has been analyzed using similar techniques. The suspended multilayer graphene produced using the process described in this disclosure is also of very high quality, yield, homogeneity and uniformity.

Next some examples of obtaining three-layer graphene by means of the method of the disclosure are described.

Figure 11:
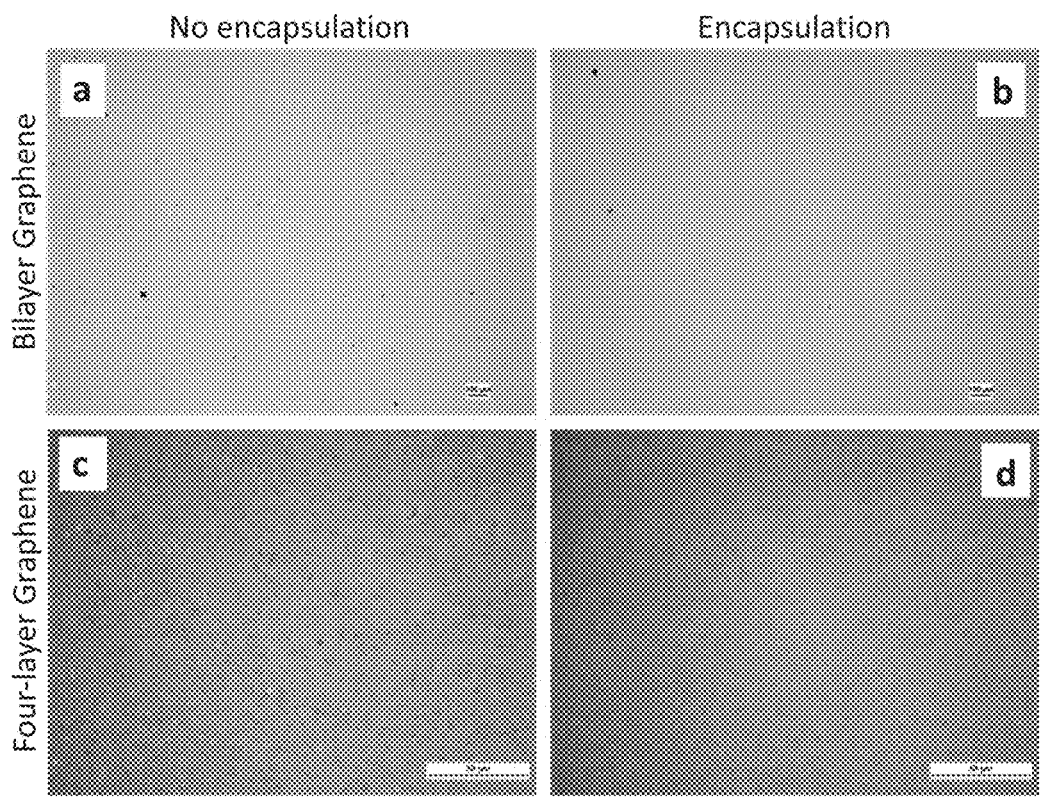
FIG. 11(*a-d*) shows the result of a first experiment.

In a first experiment, bilayer graphene has been produced by transferring monolayer Graphene onto monolayer Graphene/Cu as described with reference to FIG. 4, that is to say, without using frames (and therefore without isolation provided by the one or two frames), as taught by Jing-Jing Chen et al. in "Fabrication and Electrical Properties of Stacked Graphene Monolayers", Scientific Reports, 4:5065, DOI: 10.1038/srep05065 (27 May 2014). This is shown in FIG. 11*a*. Also, bilayer graphene has been produced according to the method of this disclosure, using two frames as shown in FIGS. 6A-6B (but with two layers of graphene). This is shown in FIG. 11*b*. As can be seen in FIG. 11*a*, a high amount of impurities are trapped in between the two graphene layers with respect to those trapped in the case of using frames (FIG. 11*b*). This is because the encapsulation proposed in the present disclosure strongly reduces the amount of impurities. The experiment was repeated for obtaining 4-layer graphene: 4-layer graphene has been produced by transferring monolayer Graphene onto monolayer Graphene/Cu using a conventional multilayer process, that is to say, without using frames (and therefore without isolation provided by the two frames), as taught by Jing-Jing Chen et al. in "Fabrication and Electrical Properties of Stacked Graphene Monolayers", Scientific Reports, 4:5065, DOI: 10.1038/srep05065 (27 May 2014). This is shown in FIG. 11*c*. Also, 4-layer graphene has been produced according to the method of this disclosure, using two frames as shown in FIGS. 6A-6B or 10A (but with 4 layers of graphene). This is shown in FIG. 11*d*. As can be observed, the amount of impurities when using the encapsulation method of this disclosure is substantially reduced.

Figure 12:
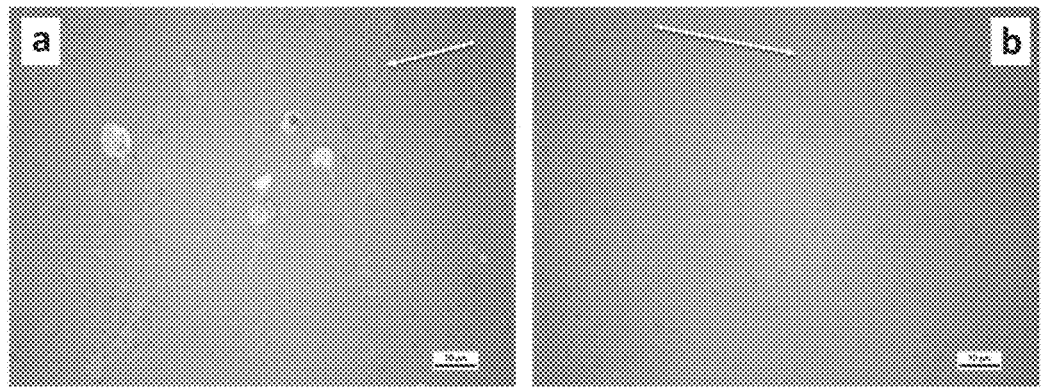
FIG. 12(*a-b*) shows the result of a second experiment.

In a second experiment, it is proved that the encapsulation of multilayer graphene with frames as proposed in the present disclosure contributes to keeping the mechanical integrity of the multilayer graphene and to minimize the friction between layers, reducing the amount and size of holes in the graphene. FIG. 12*a* shows a bilayer graphene sample produced by standard multilayer transfer as taught by Jing-Jing Chen et al. in "Fabrication and Electrical Properties of Stacked Graphene Monolayers", Scientific Reports, 4:5065, DOI: 10.1038/srep05065 (27 May 2014); in this case, when etching the Cu foil of the protective layer/graphene layer/graphene layer/metal foil stack shown for example in FIG. 4, there is strong friction in between the layers during Cu etching. As result, a lot of holes, marked with an arrow, can be observed in the bilayer graphene stack shown in FIG. 12*a*. FIG. 12*b* shows the improvements obtained in terms of size and amount of holes achieved when the method according to the present disclosure is used (frames encapsulating the stack).

In a third experiment, the sheet resistance of different samples of multilayer graphene (2 layers, 3 layers and 4 layers) obtained by using different transfer processes has been analysed and the results summarized in Table 1. The sheet resistance indicates the resistance that the material poses to the electric current. The inverse concept to the sheet resistance is the electrical conductivity. Thus, low sheet resistance implies high electrical conductivity and vice versa. As can be observed, when using multilayer graphene samples produced by a standard multilayer transfer, as taught by Jing-Jing Chen et al. in "Fabrication and Electrical Properties of Stacked Graphene Monolayers", Scientific Reports, 4:5065, DOI: 10.1038/srep05065 (27 May 2014), although the sheet resistance decreases when stacking 3 layers of graphene with respect to stacking 2 layers of graphene, there is a strong variation in the values obtained as a consequence of the water, the holes and the impurities that are trapped in between the layers. The encapsulation method proposed in the present disclosure significantly improves these values, not also decreasing the sheet resistance but also minimising the variation range. In addition, with the standard multilayer transfer no decreasing in the sheet resistance was observed when stacking 4 layers of graphene. The reason seems to be related to the high amount of impurities that are trapped in between the layers as observed in the first experiment (FIG. 11*c*).

TABLE 1

| | Sheet Resistance ($\Omega$/sq) | |
|---|---|---|
| | 300 nm $SiO_2$/Si Substrate | |
| N° layers | Standard Multilayer transfer | Multilayer transfer with encapsulation |
| 1L | 450 ± 20 | |
| 2L | 309 ± 145 | 266 ± 6 |
| 3L | 205 ± 105 | 159 ± 10 |
| 4L | 240 ± 98 | 130 ± 8 |

The examples show that accumulating several layers of graphene without trapping impurities between these layers has been achieved. By simply repeating the method as many times as an application may require, a thick multiplayer graphene can be obtained.

On the other hand, the disclosure is obviously not limited to the specific embodiment(s) described herein, but also encompasses any variations that may be considered by any person skilled in the art (for example, as regards the choice of materials, dimensions, components, configuration, etc.), within the general scope of the disclosure.

The invention claimed is:

1. A method of obtaining multilayer graphene, the method including the following steps:
   depositing a first graphene monolayer having a protective layer on top thereof, on a first sample comprising a second graphene monolayer grown on a first metal foil;
   attaching to said first metal foil a first frame, said first frame comprising a substrate and a thermal release adhesive polymer layer, the outer perimeter of the first frame extending from the outer perimeter of the first metal foil;
   etching said first metal foil;
   depositing the stack formed by said protective layer, said first graphene monolayer, said second graphene monolayer and said first frame on a second sample comprising a third graphene monolayer grown on a second metal foil;
   removing said first frame;
   attaching to said second metal foil another frame, said another frame comprising a substrate and a thermal release adhesive polymer layer;
   etching said second metal foil; and
   repeating the previous steps as many times as layers of graphene need to be stacked to form a stack of multilayer graphene.

2. The method of claim 1, further including the following steps:
   at the stage in which the first frame is attached to said first metal foil, attaching to said protective layer a second frame, said second frame comprising a substrate and a thermal release adhesive polymer layer;
   sealing said first and second graphene monolayers by pressing said first and second frames against each other, in such a way that the distance between said graphene monolayers is minimized and said graphene monolayers become totally surrounded by the outer perimeter of said frames;
   wherein the stack to be deposited on the second sample comprising the third graphene monolayer grown on the second metal foil is the stack formed by said second frame, said protective layer, said first graphene monolayer, said second graphene monolayer and said first frame;
   wherein the stage or removing said first frame further includes removing said second frame;
   wherein the stage of attaching to said second metal foil another frame further includes attaching an additional frame to said protective layer;
   repeating the previous stages as many times as layers of graphene need to be stacked to form a stack of multilayer graphene.

3. The method of claim 1, further including the following steps, once the first metal foil and/or the second metal foil has been removed or detached:
   drying the stack comprising said protective layer and graphene monolayers;
   depositing the stack onto a substrate;
   removing the frame or frames attached for the last time.

4. The method of claim 3, wherein said substrate is a flat substrate or a substrate having cavities or holes or a substrate comprising a water-soluble layer.

5. The method of claim 1, wherein said protective layer is selected from the following group: poly (methyl methacrylate) (PMMA), cellulose nitrate (NC), cellulose acetate butyrate (CAB), poly (lactic acid) (PLA), polyvinyl alcohol (PVA), poly (phthalaldehyde) (PPA), poly(bisphenol A carbonate) (PC), as well as any combination or derivative of any of the former compounds.

6. The method of claim 5, wherein said protective layer is made of poly (methyl methacrylate) (PMMA).

7. The method of claim 1, wherein said frames have a Young's modulus equal or higher than 10MPa.

8. The method of claim 7, wherein said frames are made of an adhesive tape.

9. The method of claim 1, wherein the removal of said frame or frames is done by cutting through said protective layer through at least one inner border of the frame or frames.

10. The method of claim 1, wherein after removing said first metal foil and/or said second metal foil by an etchant solution, the sample is cleaned with distilled water.

11. The method of claim 1, further including the step of removing said protective layer.

12. A method of obtaining multilayer graphene, the method including the following steps:
   depositing a first graphene monolayer having a protective layer on top thereof, on a first sample comprising a second graphene monolayer grown on a first metal foil;
   attaching to said protective layer a first frame and attaching to said first metal foil a second frame, said first frame and said second frame comprising a substrate and a thermal release adhesive polymer layer;
   sealing said first and second graphene monolayers by pressing said first and second frames against each other, in such a way that the distance between said graphene monolayers is minimized and said graphene monolayers become totally surrounded by the outer perimeter of said frames;
   removing or detaching said first metal foil while said sealing of said first and second graphene monolayers prevents impurities from damaging said first and second graphene monolayers.

13. The method of claim 12, further including the following steps:
   depositing the stack formed by said first frame, said protective layer, said first graphene monolayer, said second graphene monolayer and said second frame on a second sample comprising a third graphene monolayer grown on a second metal foil;
   removing said first and second frames;
   attaching to said protective layer a third frame and attaching to said second metal foil a fourth frame, said third and fourth frames comprising a substrate and a thermal release adhesive polymer layer;
   sealing said graphene monolayers by pressing said third and fourth frames against each other, in such a way that the distance between said graphene monolayers is minimized and said graphene monolayers become totally surrounded by the outer perimeter of said third and fourth frames;
   removing or detaching said second metal foil while said sealing of said graphene monolayers prevents impurities from damaging said graphene monolayers;
   repeating the previous stages as many times as layers of graphene need to be stacked to form a stack of multilayer graphene.

* * * * *